United States Patent [19]

Coldren et al.

[11] Patent Number: 4,873,696
[45] Date of Patent: Oct. 10, 1989

[54] SURFACE-EMITTING LASERS WITH PERIODIC GAIN AND A PARALLEL DRIVEN NIPI STRUCTURE

[75] Inventors: Larry A. Coldren, Santa Barbara; Jeffery W. Scott, Isal Vista; Ran H. Yan, Goleta, all of Calif.

[73] Assignee: The Regents of the University of California, Berkeley, Calif.

[21] Appl. No.: 265,146

[22] Filed: Oct. 31, 1988

[51] Int. Cl.$^4$ .............................................. H01S 3/19
[52] U.S. Cl. .......................................... 372/96; 372/46
[58] Field of Search ...................... 372/96, 108, 44, 45, 372/46, 92

[56] References Cited

U.S. PATENT DOCUMENTS

| | | | |
|---|---|---|---|
| 4,644,553 | 2/1987 | Van Ruyven et al. | 372/46 |
| 4,660,207 | 4/1987 | Svilans | 372/46 |
| 4,665,527 | 5/1987 | Akiba et al. | 372/96 |
| 4,675,876 | 6/1987 | Svilans | 372/96 |
| 4,706,101 | 11/1987 | Nakamura et al. | 372/46 |
| 4,752,934 | 6/1988 | Fukuzawa et al. | 372/46 |
| 4,797,890 | 1/1989 | Inaba et al. | 372/46 |

Primary Examiner—James W. Davie
Attorney, Agent, or Firm—Donald A. Streck

[57] ABSTRACT

A surface-normal cavity, AlGaAs, Distributed-Bragg Reflector laser. The laser is constructed on a GaAs substrate. There is a nipinipi . . . gain-producing active section comprised of a plurality of gain-producing i-segments disposed at periodic intervals with respect to the wavelength of an intended operating frequency of the laser is stacked vertically with respect to the surface of the substrate. A pair of Distributed-Bragg-Reflector stacks are disposed at the respective ends of the nipinipi . . . active section. A pair of electrodes are formed on either side of and operably connected to the nipinipi . . . active section in electrical contact therewith for applying a driving current to the nipinipi . . . active section in parallel. In one embodiment, the nipinipi . . . active section has interfaces between p+ and n+ sections thereof positioned at standing wave maxima of the intended operating frequency of the laser. In another, the nipinipi . . . active section has interfaces between p+ and n+ sections thereof displaced from standing wave maxima of the intended operating frequency of the laser an amount which will allow the impedance discontinuity of the active segment to result in more in-phase reflection components whereby the gain-producing active section acts as a mirror and the net effective reflectivity of the laser is increased.

19 Claims, 3 Drawing Sheets

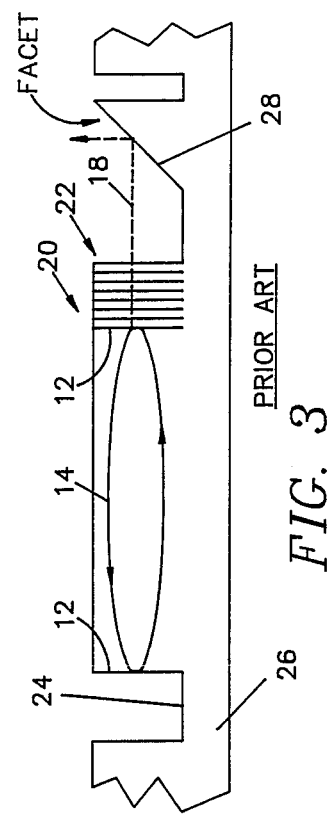
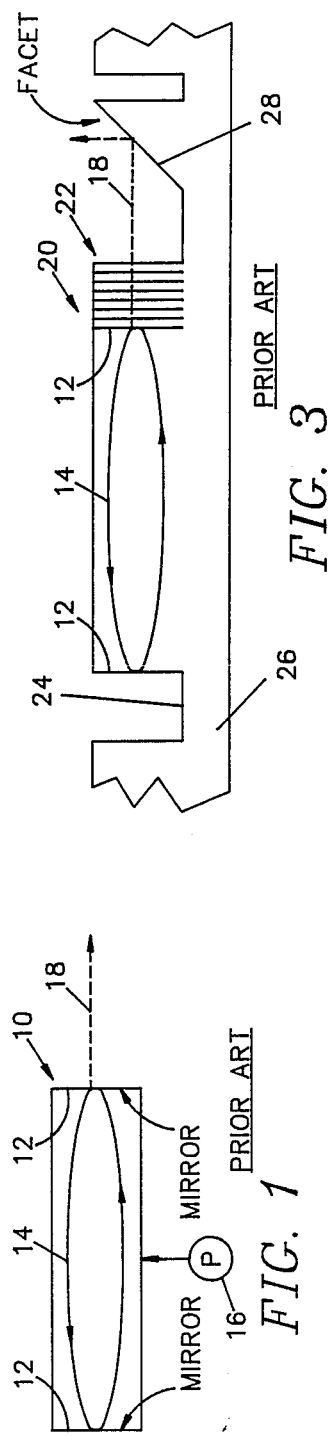
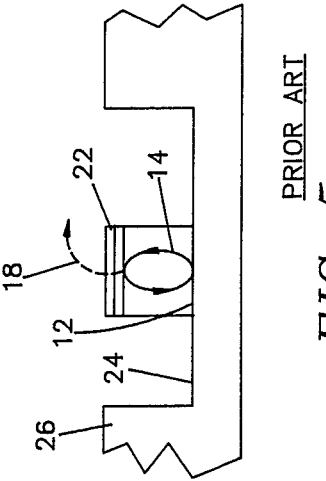
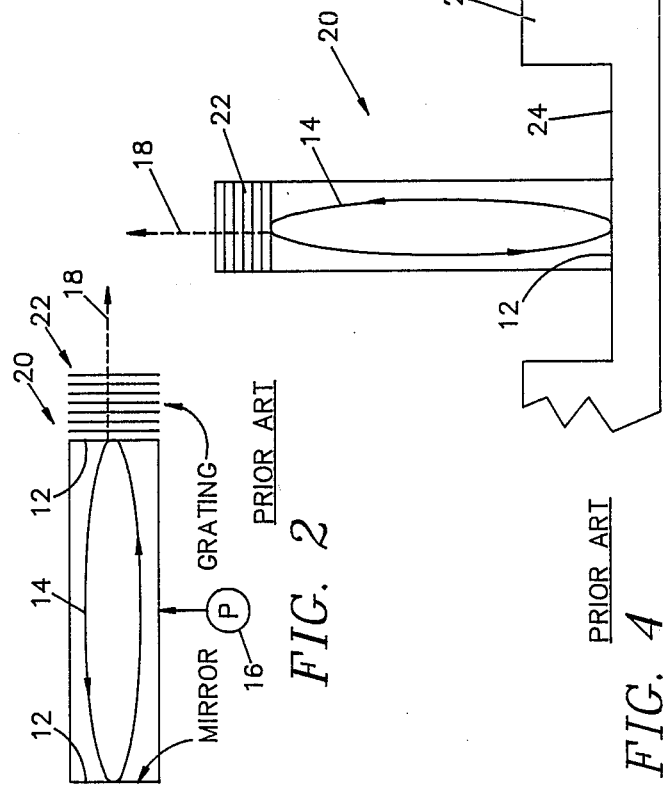

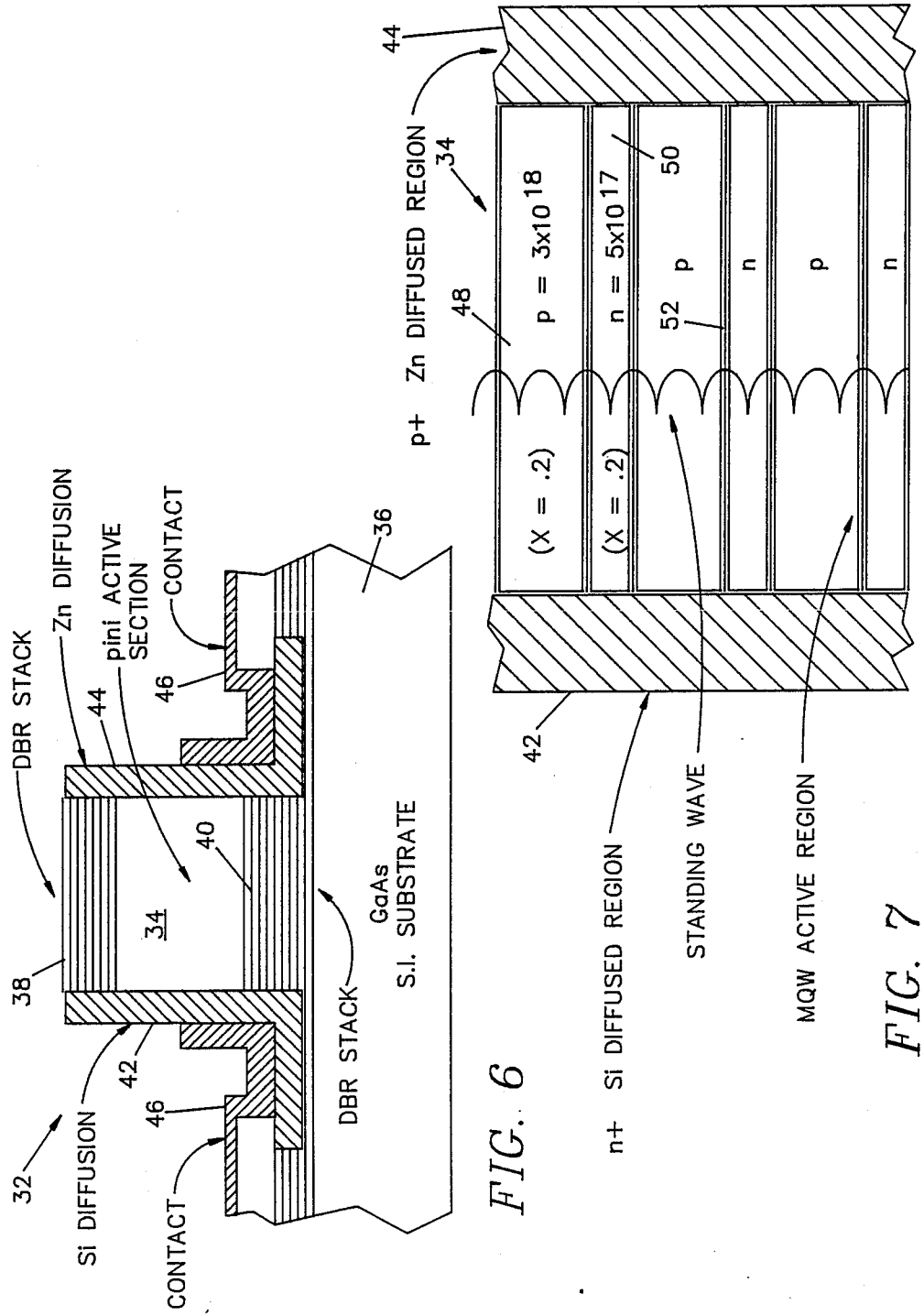

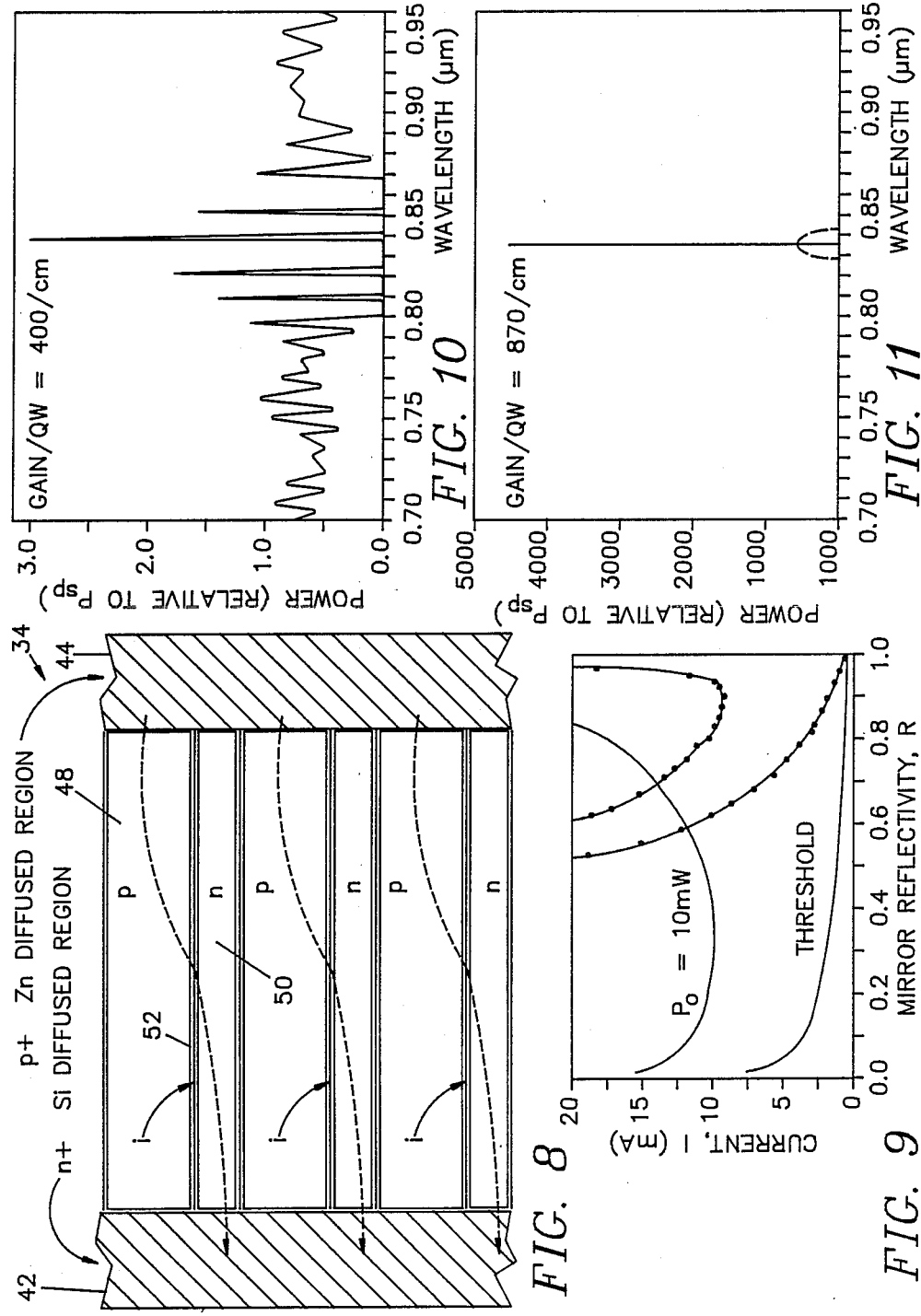

SURFACE-EMITTING LASERS WITH PERIODIC GAIN AND A PARALLEL DRIVEN NIPI STRUCTURE

ORIGIN OF THE INVENTION

This invention was made with Government support under Grant No. DAAL03-87-K-0017 awarded by the U. S. Army Research Office. The Government has certain rights in this invention.

BACKGROUND OF THE INVENTION

This invention relates to semiconductor lasers and, more particularly, to a Distributed-Bragg-Reflector semiconductor laser comprising, a nipinipi . . . gain-producing active section comprised of a plurality of gain segments disposed at periodic intervals with respect to the wavelength of an intended operating frequency of the laser; a pair of Distributed-Bragg-Reflector stacks disposed at the respective ends of the nipinipi . . . active section; and, electrode means operably connected to the nipinipi . . . active section in electrical contact therewith for applying a driving current to the nipinipi . . . active section.

Diode lasers are being used increasingly in such applications as communications, sensing, and so-called optical computing. A typical diode laser is shown in FIG. 1 where it is generally indicated as 10. The laser 10 has a mirror 12 at each end. A light beam 14 is created and amplified within the laser 10 by the pumping current source 16 operably connected thereto. The light beam 14 is created by a process termed "spontaneous emission" over a bandwidth around some center frequency. Some of this light is captured by the dielectric waveguide formed by the active medium. The guided light is reflected by mirrors 12 that create a Fabry-Perot resonant cavity. The modes of this resonant cavity are spaced nearly equally in frequency according to $\Delta f = c/(2n_g l)$, where $n_g$ is the group index of the waveguide and $l$ is the mirror spacing. Simply put, these mode frequencies are those for which $l$ is an integer number of half wavelengths, or those at which the lightwave 14 adds constructively to itself after traversing the roundtrip of the cavity. Likewise, the mirrors 12 do not reflect 100% of the light striking them. As a consequence, there is some loss through the mirrors 12 at each reflection by the light beam 14. Also, there is propagation loss in the waveguide between the mirrors 12. As energy is added to the system by the current source 16, those frequency components of the light beam 14 which are in phase with the spacing of the mirrors 12 (i.e. Fabry-Perot modes) tend to be additive while those which are out of phase have components which tend to cancel out. The additive components continue to build in power until the laser "lases". That occurs at the current where the gain of the active medium equals the losses of the cavity waveguide and mirrors. Above this "threshold" current, the output laser light 18 from laser 10 increases rapidly in value.

As shown in FIG. 2, one can make a two part diode laser 20 by replacing one of the mirrors 12 with, for example, a grating 22. The grating 22 provides a multiple reflective surface at the one end such that there are multiple spacings between the single mirror 12 and the multiple reflective surfaces of the grating 22. Thus, there are fewer frequency bands in the emitted laser light 18.

In the growing field of optical communications and computing (and in similar applications), requirements of the total technique require the ability to form diode lasers as part of the overall computer structure and its interconnections on a single chip. As can be appreciated, such integrated optoelectronics must be highly accurate (to "aim" the laser beam produced from stage to stage on the circuit) and must have highly polished (i.e. "minimally damaged") surfaces associated therewith to minimize optical losses which could make the circuitry inoperative. Some of the first reactive etching efforts relative to optoelectronics were for the construction of laser facets and narrow etched grooves to create coupled-cavity laser structures similar to the surface-emitting structure depicted in FIG. 3. To get the power required from the laser 10, it is formed horizontally into the surface 24 of the semiconductor material 26 (i.e. inplane) in substantially the same manner as the other components of the circuit. The laser mirror facets are etched by critical etching techniques known in the art. To get the laser light 18 to emerge from the surface 24, a reflective facet 28 must be formed adjacent the point of emergence from the laser 20 so as to reflect the laser light 18 in the desired direction. As can be appreciated, high resolution pattern transfer and smooth vertical laser facets are required for efficient reflection of optical signals in optoelectronic integrated circuits (OEICs). Also, and more important, an in-plane laser such as depicted in FIG. 3 occupies a lot of "real estate"; that is, it occupies valuable space on the surface 24 of the semiconductor material 26 that could be used for a multitude of other components. If the same construction as employed for the horizontal laser 10 of FIG. 3 were to be utilized for a vertically oriented laser that would produce a laser beam of like power normal to the surface 24 of the semiconductor material 26 while occupying less area, it would have to project above the surface 24 as depicted in FIG. 4 and, therefore, would be nearly impossible to make and worthless with respect to planar integration. By changing the parameters and building a short cavity laser with similar mirrors and low area which is flush with the surface 24 of the semiconductor material 26 as depicted in FIG. 5, given the power available to drive it, the laser threshold level would be high and the power level of the resultant laser light 18 would be so low as to be virtually worthless. Thus, no practical method for constructing a surface-emitting laser with a useful power level output as part of OEICs presently exists in the art.

Wherefore, it is the object of the present invention to provide such a surface-emitting laser with a useful power level output which can be easily incorporated into OEICs employing presently available assembly apparatus and technology.

It is another object of the present invention to provide a surface-normal Distributed-Bragg-Reflector laser which utilizes parallel connections to a nipinipi . . . active region with periodically spaced i-gain segments and quarter-wave mirror stacks such that threshold currents and output powers are comparable to in-plane lasers of the same junction area.

Other objects and benefits of the present invention will become apparent from the description which follows hereinafter when taken in conjunction with the drawing figures which accompany it.

SUMMARY

The foregoing objects have been achieved in the surface-normal cavity, Distributed-Bragg-Reflector laser of the present invention comprising, a substrate; a nipinipi ... gain-producing active section comprised of a plurality of gain segments disposed at periodic intervals with respect to the wavelength of an intended operating frequency of the laser, the nipinipi ... active section being stacked vertically with respect to the surface of the substrate; a pair of Distributed-Bragg-Reflector stacks disposed at the respective ends of the nipinipi ... active section; and, electrode means operably connected to the nipinipi ... active section in electrical contact therewith for applying a driving current to the nipinipi ... active section.

Preferably, the laser is an AlGaAs laser and the substrate is GaAs and, additionally, the electrode means comprises a pair of electrodes formed on either side of the nipinipi ... active section in electrical contact therewith for applying a driving current to the nipinipi ... active section in parallel.

In one embodiment, the nipinipi ... active section has interfaces between p+ and n+ sections thereof positioned at standing wave maxima of the intended operating frequency of the laser.

In another embodiment, the nipinipi ... active section has interfaces between p+ and n+ sections thereof displaced from standing wave maxima of the intended operating frequency of the laser an amount which will allow the impedance discontinuity of the active segment to result in more in-phase reflection components whereby the gain-producing active section acts as a mirror and the net effective reflectivity of the laser is increased.

DESCRIPTION OF THE DRAWINGS

FIG. 1 is a simplified drawing of the basic operation principle of a laser according to the prior art.

FIG. 2 is a simplified drawing of a basic prior art semiconductor laser with a grating replacing one mirror for better frequency selectivity of the laser light output thereby.

FIG. 3 is a simplified drawing of a prior art semiconductor laser constructed in-plane as part of an optoelectronic integrated circuit showing how a facet must be formed as part of the circuit to deflect the laser light out of the plane of the circuit.

FIG. 4 is a simplified drawing of a prior art semiconductor laser constructed normal to the plane of an optoelectronic integrated circuit showing how it would extend above the surface of the circuit.

FIG. 5 is a simplified drawing of a prior art semiconductor laser constructed normal to the plane of an optoelectronic integrated circuit depicting how it would be of extremely low power output if constructed so as to not extend above the surface of the circuit.

FIG. 6 is a cutaway elevation drawing through a surface-emitting laser according to the present invention.

FIG. 7 is a simplified, enlarged, partially cutaway drawing of a portion of the nipi active section of the laser of FIG. 6 showing the thickness relationship of the various layers thereof with respect to the standing wave pattern therein.

FIG. 8 is a simplified, enlarged, partially cutaway drawing of a portion of the nipi active section of the laser of FIG. 6 in the manner of FIG. 7 showing the current flow between the parallel connections through the various layers thereof.

FIG. 9 is a graph showing current required for a surface normal or inplane laser to get a given power out. For surface-normal: dots on curves; cross sectional area = 10 $\mu m^2$; 24 MQW active segments; L=4.5 $\mu m$; internal loss = 50 $cm^{-1}$. For in-plane: smooth curves; active region 1.5 $\mu m$ wide by L=160 $\mu m$ long; internal loss = 20 $cm^{-1}$. For both, three quantum wells per junction; junction area = 240 $\mu m^2$.

FIG. 10 is a graph showing transmission through the cavity for an assumed flat gain below threshold indicating mode enhancement due to periodic gain.

FIG. 11 is a graph showing cavity output obtained by multiplying cavity transmission by the frequency dependent gain above threshold. The dashed curve indicates gain lineshape. Gain per quantum well is indicated. Vertical scale gives output power relative to the spontaneous power emitted into the mode at linecenter. $P_{sp}$ is assumed to be 1 $\mu W$.

DESCRIPTION OF THE PREFERRED EMBODIMENT

As mentioned earlier herein, efficient surface-emitting lasers are desired in optical signal processing, communications, IC-interconnections, and computing. While steady progress has been reported over the past few years, there is no presently available (or reported) practical design which has output/input characteristics comparable to diode lasers with in-plane cavities such as that depicted in FIG. 3. This invention accomplishes that goal by implementing a surface-normal cavity AlGaAs Distributed-Bragg-Reflector (DBR) laser which utilizes parallel connections to a nipinipi ... active region for electrical drive, periodically spaced gain segments in the i-layers, and quarterwave mirror stacks for feedback as shown in FIGS. 6–8. In simple terms, the geometry of the laser of the present invention can be viewed as an in-plane Multi-Quantum-Well (MQW) laser that is sliced up into many longitudinal pieces which are stacked on top of one another and driven in parallel. Thus, through this novel approach to a laser geometry the inventors herein were able to achieve a threshold current and output power comparable to that of an inplane laser of the same junction area—even though the net length of the active section in the vertical direction is <5 $\mu m$. Efforts to fabricate this structure by the inventors herein have unearthed no significant difficulties. In fact, it appears simpler to fabricate than other geometries that have already been demonstrated in the art, since no regrowths are required. The inventors are using MBE growth for vertical layer definition, reactive-ion-etching for uniform vertical columns, and side diffusion for the parallel connections to the alternating p- and n-type drive layers.

The surface-normal MQW-DBR laser of the present invention as incorporated into an optoelectronic integrated circuit (OEIC) 30 is shown in cutaway cross section in FIG. 6 where it is generally indicated as 32. There is a nipi active section 34 stacked vertically (i.e. perpendicular) to the surface of the GaAs substrate 36. A pair of Distributed-Bragg-Reflector (DBR) stacks 38, 40 are disposed at the respective ends of the nipi active section 34. A pair of parallel electrodes 42, 44 are formed on either side of the active section 34 and stacks 38, 40 in electrical contact therewith. Electrical contact is made with the electrodes 42, 44 by contacts 46 electrically connected thereto. One electrode 42 is a n+Si-diffused electrode while the other electrode 44 is a p+Zn-diffused electrode.

Surface-Emitting-Lasers (SELs) are not new in the art; but, previously reported SELs all have striven to have a more-or-less uniform gain along the length (vertical axis) of the active region. By contrast, the inventors herein have shown that by dividing the gain region into a number of segments, the lasing threshold can be reduced by about a factor of two, if the gain material is segmented and placed on half-wavelength centers along the length of the active region. This is due to an increase in the net modal gain (material gain times a confinement factor) when the gain segments are placed at standing wave maxima. The longitudinal (vertical) confinement factor is maximized, leading to a maximum modal gain for a given pumping current. Put another way, the geometry of the present invention saves the current required to pump the material near the minima by replacing it with transparent, higher bandgap layers. This scheme is easy to implement using modern MBE or MOCVD technology. The configuration also has the advantage of having a much larger modal gain for one particular longitudinal mode since the periodic gain segments match only the standing wave pattern of this one mode. This factor, in fact, is the dominant mechanism of mode selection in the laser of the present invention.

Part of the development of the present invention involved the comparison of its performance characteristics to those of prior art geometries. For example, the inventors herein compared the currents to reach threshold and a given power out vs. mean mirror reflectivity for three different cases as given below. Simple transverse pumping is assumed to avoid possible complications with the comparison.

Case (a)=The period gain structure of this invention:

The total length of the active region is 3 $\mu$m, and the width of each gain segment is determined by a desire to operate at the maximum material gain per unit of pumping current density (In GaAs this is ~500 cm$^{-1}$). The inventors optimized this width and found it to be ~100–200 Å for this length. The inventors used 200 Å widths to avoid bringing quantum effects into the picture in this comparison. (In separate calculations, the inventors found that two or three 100 Å thick quantum wells are even better as one skilled in the art might expect.) Thus, the total gain region thickness is 0.48 $\mu$m (since there are approximately twenty-four standing wave peaks in 3 $\mu$m). The barrier regions are AlGaAs with x≈0.2–0.3.

Case (b)=All GaAs active region of same total length as in case (a):

That is, 3 $\mu$m of GaAs is used. This case is considered because it might be argued that it would be most advantageous to put as much gain material in a given length of active region as possible; however, the inventors' comparison revealed that over the mirror reflectivities of interest this is not the case.

Case (c)=All GaAs active region of same total gain length as in case (a):

That is, 0.48 $\mu$m of GaAs is used. The difference between this and case (b) is that in that case, the barrier regions were replaced with GaAs while in this case, the barrier regions are removed altogether, leaving the same total gain length (i.e. 0.48 $\mu$m). This is a more optimum case since, again, the device will be operated near its point of maximum gain per unit of current density for high mirror reflectivities; however, the inventors' results again show that the periodic gain case (a) of the present invention is superior.

In all cases, the inventors assumed the current to be injected by means of a lateral PIN configuration. This allowed the use of a simple, one dimensional analysis neglecting lateral carrier nonuniformities (perhaps naively, but justified for comparison purposes). Also assumed for all cases was a simple gain vs. current of the form A(J/$\sigma$-J$_t$) where $\sigma$ is a saturation term of the form {1+J/Jo}. For GaAs - J$_t$~4000 A/cm$^2$ per cm; A and Jo are chosen to match known values of low gain slope and max. g/J at g=500 cm$^{-1}$. Internal losses of 20 cm$^{-1}$ were assumed in the GaAs regions and 10 cm$^{-1}$ in the barrier regions of case (a) (leading to an average loss of 13 cm$^{-1}$ for the first case). For case (b), 10 cm$^{-1}$ was used for the losses in the GaAs layer since the carrier density needed to achieve threshold is lower in this case.

In analyzing the results, the inventors found that over the range of 0.850.98 in mean reflectivity, the case (a) structure has the lowest threshold current. In the central part of this range, the threshold current can be a factor of two lower than either of the other cases. For mirror reflectivities ~0.99, the case (c) structure has a slightly lower threshold; but, experimentally, achieving reflectivities of this order remains dubious. For a mean reflectivity <0.85, both cases (a) and (c) diverge toward infinite threshold due to high mirror losses combined with gain saturation; however, due to the large gain volume in case (b), the threshold gain does not increase as rapidly, and hence, becomes the best scheme for low mirror reflectivities. Nevertheless, the lower thresholds and higher powers associated with the higher reflectivities are preferred for practical applications.

Several significant features of the present invention are best seen with reference to FIGS. 7 and 8. The nipi active section 34 comprises alternating p-type layers 48 and n-type layers 50 separated by MQW undoped active regions 52. Current flow is from the p+electrode 44 into and through the p-type layer 48, through the MQW active region 52, into and through the n-type layer 50, to the n+electrode 42 as shown in FIG. 8. The MQW undoped active regions 52 are placed at maxima of the cavity standing wave pattern, and the lossy highly-doped regions 48, 50 are centered on standing wave nulls as depicted in FIG. 7. This, together with the fact that the entire lateral mode width crosses the MQW active regions 52, results in a much higher net confinement factor (~0.2) than in the in-plane structure (~0.05), and the effect of the higher doped p and n drive regions is reduced. This periodic gain/loss structure also provides longitudinal mode selection if more than one mode can resonate within the mirror reflection band. To assure uniform lateral pumping, the dopings of the p- and n-type layers 48, 50 are adjusted to provide roughly the same sheet conductivity in these parallel drive layers. The diffusion processes employed also result in intermixing of Al into the quantum wells. This, together with the high doping, provides a weak index guide at the sides for good lateral mode control.

The graph of FIG. 9 compares the net drive current of the surfacenormal MQW-DBR laser 32 of the present invention to that of an analogous inplane MQW laser both having an active junction area equal to 240 $\mu$m$^2$. The currents for threshold and 10 mW of power are plotted vs. the geometric-mean mirror reflectivity. The calculations are based on a recent quantum-well theory by Yariv, et al. If the in-plane laser is assumed to have uncoated cleaved facets (R=0.32) and the surface-normal laser R=0.9, the currents for threshold and 10 mW of power out are about the same in both cases. To avoid moving into the n=2 quantum well state and excessive leakage currents, at least three quantum wells are required in each diode junction of the surface normal-case. Note that a higher internal loss is assumed for the surface-normal laser to account for the higher doping levels.

FIGS. 10 and 11 depict the predicted spectral response of the device. FIG. 10 shows the transmission through the cavity assuming a below threshold gain that is constant with frequency. The enhancement and slight pulling of the central mode is due to the periodic gain. FIG. 11 shows the calculated laser output that results by including the gain bandwidth. It is interesting that most of the mode selection in this case comes from the gain roll-off rather than the frequency selectivity of the grating mirrors. Excellent single-mode operation is predicted. A problem that is not indicated by this result is the large background of spontaneous emission of approximately 1 mW; however, suitable spatial filtering can be used to eliminate most of this.

It should also be understood that a substantial improvement in modal gain (and thus threshold current) is still possible if the gain segments are displaced slightly from the standing wave maxima. Such a displacement will allow the impedance discontinuity of the gain segment to result in more in-phase reflection components, thereby increasing the net effective reflectivity of that half of the cavity. In this way, a slight reduction in modal gain can be offset by an increase in reflectivity so that the net laser threshold will not suffer, and, if the reflection is significant, it can improve. This mode of operation is a mixture of distributed feedback (DFB) and DBR effects; that is, the gain region also acts as a mirror.

Wherefore, having thus described the present invention, what is claimed is:

1. A Distributed-Bragg-Reflector semiconductor laser comprising:
   (a) a nipinipi . . . gain-producing active section comprised of a plurality of gain segments disposed at periodic intervals with respect to the wavelength of an intended operating frequency of the laser;
   (b) a pair of Distributed-Bragg-Reflector stacks disposed at the respective ends of said nipinipi . . . active section; and,
   (c) electrode means operably connected to said nipinipi . . . active section in electrical contact therewith for applying a driving current to said nipinipi . . . active section.

2. The Distributed-Bragg-Reflector semiconductor laser of claim 1 wherein:
   said electrode means comprises a pair of electrodes formed on either side of said nipinipi . . . active section in electrical contact therewith for applying a driving current to said nipinipi . . . active section in parallel.

3. The Distributed-Bragg-Reflector semiconductor laser of claim 2 wherein:
   (a) one of said pair of electrode means is a n+Si-diffused electrode; and,
   (b) the other of said pair of electrode means is a p+Zn-diffused electrode.

4. The Distributed-Bragg-Reflector semiconductor laser of claim 2 wherein:
said pair of Distributed-Bragg-Reflector stacks are each quarterwave mirror stacks providing optimum feedback of light at the wavelength of said intended operating frequency of the laser.

5. The Distributed-Bragg-Reflector semiconductor laser of claim 1 and additionally comprising:
   (a) a substrate having said nipinipi . . . active section and said stacks mounted thereon; wherein,
   (b) said nipinipi . . . active section is stacked vertically with respect to the surface of said substrate whereby the laser is a surface-normal laser.

6. The Distributed-Bragg-Reflector semiconductor laser of claim 1 wherein:
   said nipinipi . . . active section has interfaces between p+ and n+ sections thereof positioned at standing wave maxima of said intended operating frequency of the laser.

7. The Distributed-Bragg-Reflector semiconductor laser of claim 1 wherein:
   said nipinipi . . . active section has interfaces between p+ and n+ sections thereof displaced from standing wave maxima of said intended operating frequency of the laser an amount which will allow the impedance discontinuity of the said active segment to result in more in-phase reflection components whereby said gain-producing active section acts as a mirror and the net effective reflectivity of the laser is increased.

8. A surface-normal cavity, Distributed-Bragg-Reflector laser comprising:
   (a) a substrate;
   (b) a nipinipi . . . gain-producing active section comprised of a plurality of gain segments disposed at periodic intervals with respect to the wavelength of an intended operating frequency of the laser, said nipinipi . . . active section being stacked vertically with respect to the surface of said substrate;
   (c) a pair of Distributed-Bragg-Reflector stacks disposed at the respective ends of said nipinipi . . . active section; and,
   (d) electrode means operably connected to said nipinipi . . . active section in electrical contact therewith for applying a driving current to said nipinipi . . . active section.

9. The surface-normal cavity, Distributed-Bragg-Reflector laser of claim 8 wherein:
   the laser is an AlGaAs laser and said substrate is GaAs.

10. The surface-normal cavity, Distributed-Bragg-Reflector semiconductor laser of claim 8 wherein:
    said electrode means comprises a pair of electrodes formed on either side of said nipinipi . . . active section in electrical contact therewith for applying a driving current to said nipinipi . . . active section in parallel.

11. The surface-normal cavity, Distributed-Bragg-Reflector semiconductor laser of claim 10 wherein:
    (a) one of said pair of electrode means is a n+Si-diffused electrode; and,
    (b) the other of said pair of electrode means is a p+Zn-diffused electrode.

12. The surface-normal cavity, Distributed-Bragg-Reflector semiconductor laser of claim 8 wherein:
    said pair of Distributed-Bragg-Reflector stacks are each quarter-wave mirror stacks providing optimum feedback of light at the wavelength of said intended operating frequency of the laser.

13. The surface-normal cavity, Distributed-Bragg-Reflector semiconductor laser of claim 8 wherein:

said nipinipi . . . active section has interfaces between p+ and n+ sections thereof positioned at standing wave maxima of said intended operating frequency of the laser.

14. The Surface-normal cavity, Distributed-Bragg-Reflector semiconductor laser of claim 8 wherein:

said nipinipi . . . active section has interfaces between p+ and n+ sections thereof displaced from standing wave maxima of said intended operating frequency of the laser an amount which will allow the impedance discontinuity of the said active segment to result in more in-phase reflection components whereby said gain-producing active section acts as a mirror and the net effective reflectivity of the laser is increased.

15. A surface-normal cavity, AlGaAs, Distributed-Bragg-Reflector laser comprising:

(a) a GaAs substrate;
(b) a nipinipi . . . gain-producing active section comprised of a plurality of gain segments disposed at periodic intervals with respect to the wavelength of an intended operating frequency of the laser, said nipinipi . . . active section being stacked vertically with respect to the surface of said substrate;
(c) a pair of Distributed-Bragg-Reflector stacks disposed at the respective ends of said nipinipi . . . active section; and,
(d) electrode means comprising a pair of electrodes formed on either side of and operably connected to said nipinipi . . . active section in electrical contact therewith for applying a driving current to said nipinipi . . . active section in parallel.

16. The surface-normal cavity, Distributed-Bragg-Reflector semiconductor laser of claim 15 wherein:

(a) one of said pair of electrode means is a n+Si-diffused electrode; and,
(b) the other of said pair of electrode means is a p+Zn-diffused electrode.

17. The surface-normal cavity, Distributed-Bragg-Reflector semiconductor laser of claim 15 wherein:

said pair of Distributed-Bragg-Reflector stacks are each quarterwave mirror stacks providing optimum feedback of light at the wavelength of said intended operating frequency of the laser.

18. The surface-normal cavity, Distributed-Bragg-Reflector semiconductor laser of claim 15 wherein:

said nipinipi . . . active section has interfaces between p+ and n+ sections thereof positioned at standing wave maxima of said intended operating frequency of the laser.

19. The Surface-normal cavity, Distributed-Bragg-Reflector semiconductor laser of claim 15 wherein:

said nipinipi . . . active section has interfaces between p+ and n+ sections thereof displaced from standing wave maxima of said intended operating frequency of the laser an amount which will allow the impedance discontinuity of the said active segment to result in more in-phase reflection components whereby said gain-producing active section acts as a mirror and the net effective reflectivity of the laser is increased.

* * * * *